US010224824B2

(12) United States Patent
Iorio et al.

(10) Patent No.: US 10,224,824 B2
(45) Date of Patent: *Mar. 5, 2019

(54) DRIVER FOR A POWER FIELD-EFFECT TRANSISTOR WITH A PROGRAMMABLE DRIVE VOLTAGE, AND RELATED SYSTEMS AND METHODS

(71) Applicant: STMicroelectronics S.r.l., Agrate Brianza (IT)

(72) Inventors: Alberto Iorio, Aosta (IT); Maurizio Foresta, Aosta (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/925,456

(22) Filed: Mar. 19, 2018

(65) Prior Publication Data

US 2018/0212524 A1    Jul. 26, 2018

Related U.S. Application Data

(63) Continuation of application No. 15/282,459, filed on Sep. 30, 2016, now Pat. No. 9,960,692.

(51) Int. Cl.
| | | |
|---|---|---|
| H02M 3/335 | (2006.01) |
| H02M 1/32 | (2007.01) |
| H03K 17/687 | (2006.01) |
| H02M 1/08 | (2006.01) |
| H03K 3/012 | (2006.01) |
| H03K 17/16 | (2006.01) |
| H03K 17/30 | (2006.01) |

(52) U.S. Cl.
CPC ......... *H02M 3/33523* (2013.01); *H02M 1/08* (2013.01); *H03K 3/012* (2013.01); *H03K 17/163* (2013.01); *H03K 17/687* (2013.01); *H02M 3/335* (2013.01); *H02M 3/33592* (2013.01)

(58) Field of Classification Search
CPC ............. H02M 3/335; H02M 3/33523; H02M 3/33569; H02M 3/33576; H02M 3/33592; H02M 1/32; H03K 17/30; H03K 17/302
See application file for complete search history.

(56) References Cited

U.S. PATENT DOCUMENTS

| | | |
|---|---|---|
| 5,289,051 A | 2/1994 | Zitta |
| 5,396,412 A | 3/1995 | Barlage |
| 6,038,150 A * | 3/2000 | Yee .................. H02M 3/33561 363/127 |

(Continued)

*Primary Examiner* — Gary L Laxton
(74) *Attorney, Agent, or Firm* — Seed IP Law Group LLP

(57) ABSTRACT

A driver includes a high-side driver transistor coupled between supply voltage and the gate drive nodes and provides a first charge current to a high side gate node of the high-side driver transistor until the gate drive node reaches a first gate drive threshold. Then a second charge current is provided to the high side gate node that is less than the first charge current. The gate drive node is limited to a first clamped threshold for a delay time. A gate drive current rise signal sets the value of the second charge current that charges the high side gate node and after the delay time the gate drive voltage is limited to a second clamped threshold greater than the first clamped threshold but less than the supply voltage. A gate drive programmable control signal sets the value of the second clamped threshold.

20 Claims, 10 Drawing Sheets

(56) References Cited

U.S. PATENT DOCUMENTS

| | | | |
|---|---|---|---|
| 6,061,255 | A | 5/2000 | Chik et al. |
| 6,111,769 | A | 8/2000 | Zhang et al. |
| 6,297,970 | B2 | 10/2001 | Hemena et al. |
| 6,490,179 | B1 * | 12/2002 | Boylan .................. H02M 1/38 363/127 |
| 7,161,813 | B2 | 1/2007 | Librizzi et al. |
| 7,378,878 | B2 | 5/2008 | Major |
| 9,960,692 | B2 * | 5/2018 | Iorio ................ H02M 3/33523 |
| 2009/0002054 | A1 | 1/2009 | Tsunoda et al. |
| 2009/0175056 | A1 | 7/2009 | Choi |
| 2011/0241738 | A1 | 10/2011 | Tamaoka |

\* cited by examiner

DRIVER FOR A POWER FIELD-EFFECT TRANSISTOR WITH A PROGRAMMABLE DRIVE VOLTAGE, AND RELATED SYSTEMS AND METHODS

BACKGROUND

Technical Field

The present disclosure relates generally to driving Field-Effect Transistors (FETs) and, more specifically, to controlling a drive signal applied to an FET to improve the switching operation of the FET.

Description of the Related Art

In converters such as flyback and LLC resonant converters, as well as in other types of converters, when using synchronous rectification in control of the converter, a synchronous rectification circuit drives one or more synchronous rectification (SR) switches during operation of the converter. Each of these SR switches is typically an FET, such as a metal oxide semiconductor FET (MOSFET), although the SR switches may be other types of transistors as well like insulated gate bipolar junction transistors (IGBTs). In the present application, the SR switches are discussed as being power MOSFETs by way of example and those skilled in the art will appreciate that the concepts disclosed herein in relation to such power MOSFETs may be applicable to other types of transistors and circuit structures as well.

A power MOSFET has an associated gate charge curve that defines the relationship between the gate-to-source voltage $V_{GS}$ of the MOSFET and the total charge on the gate of the MOSFET, as will be appreciated by those skilled in the art. The gate charge curve includes several phases or regions, and controlling the current supplied to charge the gate in each of these regions can be advantageous and improve the switching operation of the MOSFET and the converter including the MOSFET. A MOSFET gate charge curve includes two inflection points starting from a zero gate-to-source voltage until the gate-to-source voltage reaches a peak gate drive voltage, which is typically approximately the value of a supply voltage of the circuit driving the gate of the MOSFET. These two inflection points define three regions: 1) a sub threshold region; 2) a saturation or Miller plateau region; and 3) a linear region. In the second or Miller plateau region, for example, the current/charge injected into the gate of the MOSFET does not significantly increase the gate-to-source voltage due at least in part to the gate-to-drain capacitance being substantially charged instead of the gate-to-source capacitance in this region. As a result, the current flowing to charge the gate of the MOSFET in the Miller plateau region may be advantageously controlled to control the length or duration of this region. In this way, the generation of unwanted electromagnetic interference (EMI), which may otherwise be generated by fast rising edges of a gate drive signal applied to the MOSFET, may be reduced by controlling the current supplied by the gate drive signal in this region. During the plateau region the gate-to-source voltage VGS has a slowly changing or approximately constant first gate drive value.

In the linear region, which is the region after the plateau region in the gate charge curve, the gate drive signal typically supplies a large current to quickly charge the gate of the MOSFET and thereby drive the gate-to-source voltage VGS to the peak gate drive voltage. Such a fast rising edge of the gate-to-source voltage VGS may, as previously mentioned, result in the generation of unwanted EMI. In controlling the activation or turning ON of a power MOSFET, as well as deactivating or turning OFF the MOSFET, the current supplied by the gate drive signal to charge or discharge the gate in the respective regions of the gate charge curve is ideally controlled to improve the switching operation of the MOSFET and thereby improve the converter including the MOSFET. There is a need for improved drive circuits and methods for controlling the turning ON and OFF a power MOSFET in converters and other circuits.

BRIEF SUMMARY

In one embodiment of the present disclosure, a driver includes a supply voltage node configured to receive a supply voltage and a gate drive node configured to be coupled to a gate node of a power transistor, such as a synchronous rectifier switch in an LLC resonant converter. The driver further includes a high-side driver transistor coupled between the supply voltage node and the gate drive node, and having a high side gate node. The driver operates, in response to an activation signal going active, in a first mode to provide a first charge current to the high side gate node until a gate drive voltage on the gate drive node reaches a first gate drive threshold. The driver then operates in a second mode responsive to the gate drive voltage reaching the first gate drive threshold to provide a second charge current to the high side gate node that is less than the first charge current and to limit the gate drive voltage to a first clamped threshold. The driver receives a gate drive current rise signal that sets the value of the second charge current and operates in the second mode for a delay time after the gate drive voltage reaches the first gate drive threshold. The driver, after expiration of the delay time, operates in a third mode to provide the second charge current to the high side gate node and to limit the gate drive voltage to a second clamped threshold that is greater than the first clamped threshold but less than the supply voltage. The driver receives a gate drive programmable control signal that sets the value of the second clamped threshold.

In an embodiment, a driver includes a supply voltage node configured to receive a supply voltage and a gate drive node configured to be coupled to a gate node of a power transistor. The driver further includes a high-side driver transistor coupled between the supply voltage node and the gate drive node and including a high side gate node. The driver operates in a first mode to provide a first charge current to the high side gate node until a gate drive voltage on the gate drive node reaches a first gate drive threshold. The driver then operates in a second mode responsive to the gate drive voltage reaching the first gate drive threshold to provide a second charge current to the high side gate node and to limit the gate drive voltage to a first clamped threshold. The driver operates in the second mode for a delay time after the gate drive voltage reaches the first gate drive threshold. After expiration of the delay time, the driver operates in a third mode to provide the second charge current to the high side gate node and to limit the gate drive voltage to a second clamped threshold.

BRIEF DESCRIPTION OF THE SEVERAL VIEWS OF THE DRAWINGS

For a better understanding of the present disclosure, embodiments thereof are now described purely by way of non-limiting example, with reference to the attached drawings, wherein.

DETAILED DESCRIPTION

Figure 1:
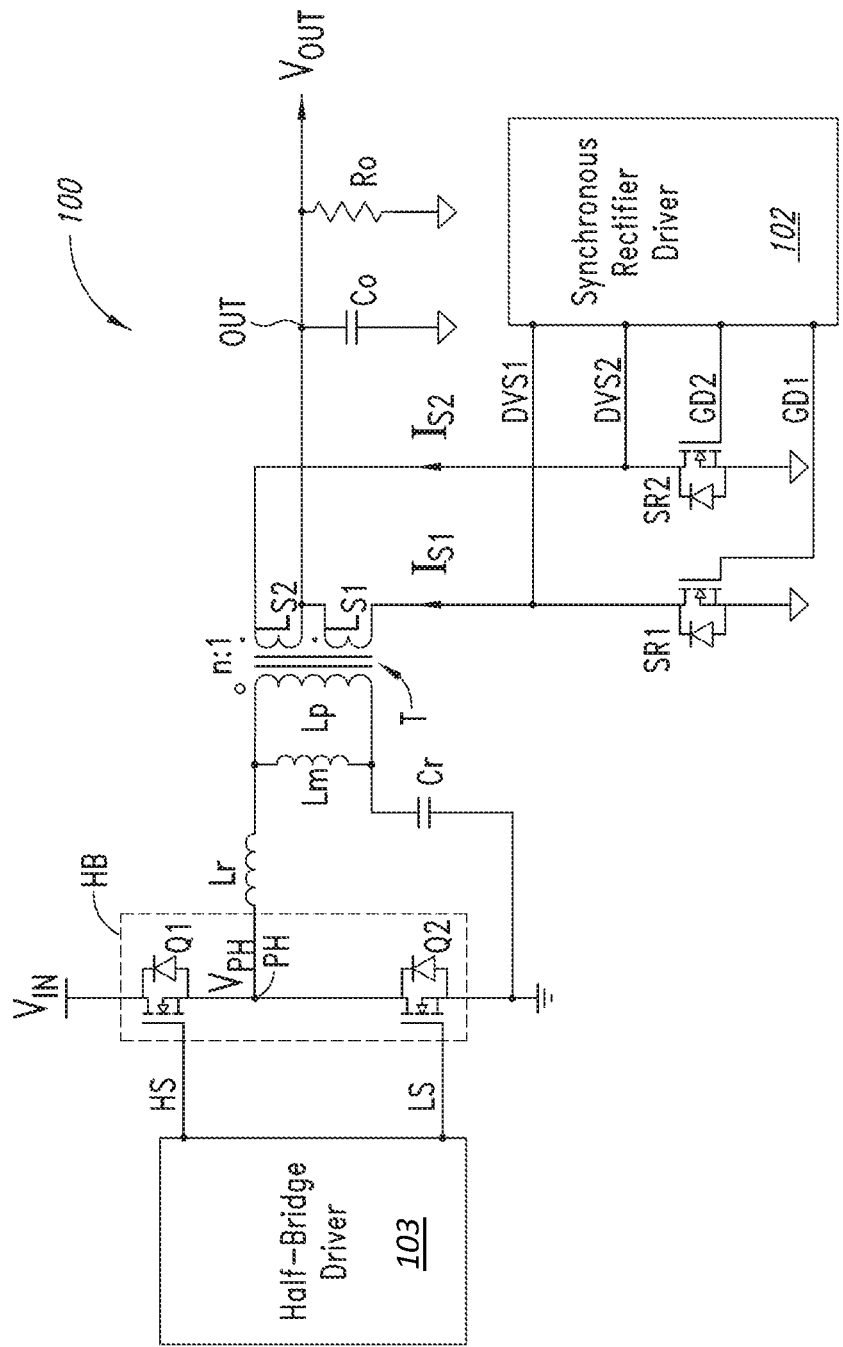
FIG. 1 is a schematic of an LLC resonant converter including a synchronous rectifier driver according to one embodiment of the present disclosure.

FIG. 1 is a schematic of an LLC resonant converter 100 including a synchronous rectifier driver 102 according to one embodiment of the present disclosure. In operation, the synchronous rectifier driver 102 generates programmable gate drive signals GD1 and GD2 that are applied to control the operation of synchronous rectification (SR) switches SR1 and SR2, respectively, of the LLC resonant converter 100. Characteristics of the gate drive signals GD1 and GD2 are programmable and thus variable, allowing the gate drive signal supplied to each SR switch SR1, SR2 to be adjusted to optimize or at least improve the operation of the SR switch during operation of the LLC resonant converter 100, as will be explained in more detail below.

In the present description, certain details are set forth in conjunction with the described embodiments to provide a sufficient understanding of the present disclosure. One skilled in the art will appreciate, however, that embodiments of the disclosure may be practiced without these particular details. Furthermore, one skilled in the art will appreciate that the present disclosure is not limited to the example embodiments described herein, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. The operation of well-known components and/or processes has not been shown or described in detail to avoid unnecessarily obscuring the present disclosure. Finally, components that are common among the described embodiments are given the same reference numbers or descriptors in the present application even though the detailed operation of such components may vary among embodiments.

The theory and overall operation of LLC resonant converters such as the LLC resonant converter 100 of FIG. 1 is well understood by those skilled in the art, and will not be described in detail herein. As a result, the overall operation of the LLC resonant converter 100 will only briefly be described before describing in detail the operation of the synchronous rectifier driver 102 in generating the variable gate drive signals GD1 and GD2 that drive the SR switches SR1, SR2 as mentioned above. A primary side of the LLC resonant converter 100 includes a half-bridge circuit HB formed by series-connected power switches Q1 and Q2, which are power MOSFETs in the embodiment of FIG. 1, coupled between a node receiving a supply voltage VIN and a reference voltage node. A half-bridge driver 103 generates a high-side gate drive signal HS and a low-side gate drive signal LS to drive the gates of the switches Q1 and Q2, respectively, and thereby generate a phase voltage signal V PH on a phase node PH defined between the interconnection of the switches Q1 and Q2. The primary side further includes a resonant inductor Lr coupled in series with a magnetizing inductor Lm and resonant capacitor Cr between the phase node PH and the reference node. The magnetizing inductor LM is coupled across the primary winding LP of a transformer T. The secondary side of the LLC resonant converter 100 includes two center tapped secondary windings LS1 and LS2 of the transformer T, with the center tap of these two secondary windings being coupled to an output node OUT having an output capacitor C0 and resistor R0 are coupled across the output node OUT to filter the signal generated on the output node and generate a DC output voltage V OUT provided by the LLC resonant converter. The SR switches SR1 and SR2 are coupled in series with the secondary windings LS 1 and LS 2, respectively, between the output node OUT and a reference node.

In operation, the half-bridge driver 103 drives generates the HS and LS signals to drive the power switches Q1 and Q2 alternately with a fifty percent duty cycle for each power switch. In this way, the half-bridge circuit HB functions as a square wave generator to generate a square wave VPH signal on the phase node pH. The resonant inductor Lr, capacitor Cr and magnetizing inductor Lm form a resonant network that varies the coupling of the VPH signal to the primary winding Lp of the transformer T. In this way, the half-bridge driver 103 controls the frequency of the VPH signal to thereby adjust the value of the generated output voltage VOUT. The synchronous rectifier driver 102 generates the gate drive signals GD1 and GD2 to control the switching of the SR switches SR1 and SR2 to rectify alternating or "AC" currents IS1 and IS2 that flow through the secondary windings LS1 and LS2, respectively, responsive to magnetic flux flowing through the primary winding LP of the transformer T responsive to the VPH signal. In this way, the synchronous rectifier driver 102 performs synchronous rectification of the IS1 and IS2 currents to thereby generate the DC output voltage VOUT on the output node OUT.

The synchronous rectifier driver 102 senses drain voltage signals DVS1 and DVS2 of the SR switches SR1 and SR2, and utilizes these drain voltage signals in controlling the activation and deactivation of the SR switches. More specifically, the synchronous rectifier driver 102 controls the GD1, GD2 signals to turn ON each SR switch SR1, SR2 when the corresponding secondary winding LS1, LS2 of the transformer T is conducting, which occurs when the body diode of the corresponding switch SR1, SR2 starts conducting. Conversely, the synchronous rectifier driver 102 turns OFF each switch SR1, SR2 when the current IS1, IS2 flowing through the switch is approximately zero. One skilled in the art will understand the overall operation of the generating the GD1, GD2 signals to control the SR1, SR2 switches during operation of the LLC resonant converter 100, and thus this operation will not be described in more detail herein.

Figure 2:
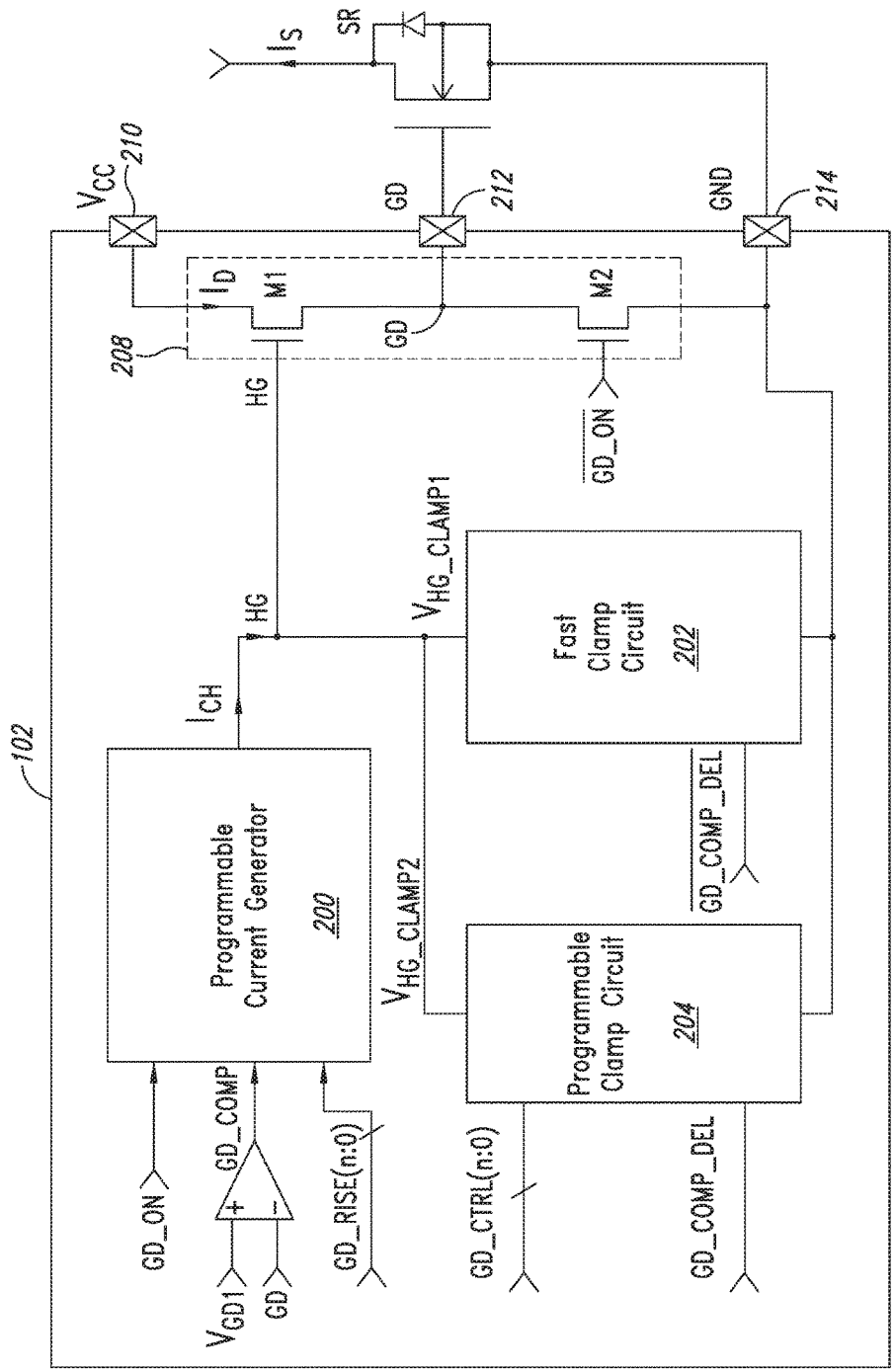
FIG. 2 is a functional block diagram of one embodiment of the synchronous rectifier driver of FIG. 1.

The specific characteristics of the gate drive signals GD1, GD2 generated by the synchronous rectifier driver 102 for driving the SR switches SR1, SR2 according to embodiments of the present disclosure will now be described in more detail with reference to FIGS. 2-4. FIG. 2 is a functional block diagram of one embodiment of the synchronous rectifier driver 102 of FIG. 1. The functional block diagram of FIG. 2 shows only a portion of the synchronous rectifier driver 102 for generating one of the gate drive signals GD1, GD2. Thus, in FIG. 2 the synchronous rectifier driver 102 generates a gate drive signal GD that corresponds to either the GD1 or GD2 signal of FIG. 1, and this GD signal is applied to drive the gate of an SR switch SR that corresponds to either the switch SR1 or SR2. The synchronous rectifier driver 102 generates the GD signal driving the SR switch with a programmable current generator 200 operating in combination with a fast clamp circuit 202 and a programmable clamp circuit 204 to generate the GD drive signal having the desired characteristics for driving the SR switch, as will now be explained in more detail.

The programmable current generator 200 receives a gate drive activation signal GD_ON indicating the SR switch is to be turned ON or activated. As previously mentioned, the synchronous rectifier driver 102 turns ON the SR switch when the corresponding drain voltage signal DVS1, DVS2 (FIG. 1) indicates that the body diode of that SR switch is conducting. The programmable current generator 200 also receives a gate drive current rise signal GD_RISE<n:0>, which is an (n+1) bit digital signal having a programmable value that sets a second value ICH2 of a programmable charge current ICH provided by the programmable current generator 200 during operation in region R3 (FIG. 3) of the gate drive signal GD driving the SR switch, as will be described in more detail below. Finally, the programmable current generator 200 also receives a gate drive comparator signal GD_COMP generated by a comparator 206 indicating whether the voltage level of the gate drive signal GD has reached a first gate drive threshold VGD1. The comparator 206 drives the GD_COMP signal active in response to the gate drive signal GD reaching the first gate drive threshold VGD1. The first gate drive threshold VGD1 has a value greater than a threshold value of the SR switch to ensure the SR switch is turned ON when the GD signal has reached the first gate drive threshold VGD1. For example, a typical threshold voltage VTH of the SR switch may be 4.5 V and the first gate drive threshold VGD1 may be 5.5 V.

The fast clamp circuit 202 is activated and deactivated in response to the complement of a delayed version of the GD_COMP signal, which is designated as the signal $\overline{GD\_COMP\_DEL}$ in FIG. 2. As will be explained in more detail below, the GD_COMP_DEL signal is a delayed version of the GD_COMP signal to allow for operation of driving the gate drive signal GD in region R2 of FIG. 3, as will also be explained in more detail below. The programmable clamp circuit 204 is activated in response to the GD_COMP_DEL signal going active. In this way, the fast clamp circuit 202 and programmable clamp circuit 204 operate in a complementary manner with only one of these two circuits being activated at a time. The programmable clamp circuit 204 also receives a gate drive programmable control signal GD_CTRL<n:0>, which is an (n+1) bit digital signal having a programmable value that sets a second gate drive threshold VGD_CLAMP2 at which the programmable clamp circuit limits or clamps the GD signal during operation in region R4 (FIG. 3) in driving the SR switch, as will be described in more detail below.

The synchronous rectifier driver 102 further includes an output driver 208 including series connected NMOS transistors M1 and M2 are coupled in series between a supply voltage node receiving a supply voltage Vcc and a reference voltage node at a reference voltage GND. The synchronous rectifier driver 102 is typically formed in the integrated circuit with the switch SR being an external component driven by the synchronous rectifier driver, as illustrated in FIG. 1. As a result, pins 210, 212 and 214 of such an integrated circuit for the synchronous rectifier driver 102 are shown in FIG. 2, with the pin 210 corresponding to the supply voltage node receiving the supply voltage VCC, pin 212 corresponding to the gate drive node GD that drives the SR switch, and pin 214 corresponding to the reference voltage node receiving the reference voltage GND. The gate of the NMOS transistor M1 is coupled to a high side gate node HG that receives the programmable charge current ICH provided by the programmable current generator 200. The fast clamp circuit 202 and programmable clamp circuit 204 are coupled in parallel between the HG node and the reference voltage node GND, and function, when activated, to limit the voltage on the HG node to a first clamped threshold VHG_CLAMP1 or a variable second clamped threshold VHG_CLAMP2. The second NMOS transistor M2 receives the complement of the gate drive activation signal $\overline{GD\_ON}$ and in this way the transistor M2 is turned ON when the GD_ON signal is inactive low, which occurs when the SR switch is to be turned OFF responsive to a current IS being approximately zero. The current IS corresponds to either the current IS1 for the SR switch SR1 or the current IS2 for the SR switch SR2 of FIG. 1. In response to the GD_ON signal going inactive low, the $\overline{GD\_ON}$ signal goes active high, turning ON the NMOS transistor M2 to thereby couple the GD node to the reference node GND and turn the SR switch.

In the present description the designations HG and GD are used interchangeably to refer to either the corresponding node or the signal generated on that node. For example, the HG node may in some instances be described as being coupled to the programmable current generator 200, fast clamp circuit 202 and programmable clamp circuit 204 as just discussed above. In other instances, the HG signal on this node may be discussed, such as, for example, in describing the HG signal driving the gate of the NMOS transistor M1. The same is true for the node GD, with this node being discussed in some instances and the GD signal or voltage generated on this node being utilized in other instances. This is also true for the nodes GND and VCC, which in some instances may be described a reference voltage node and supply voltage node, respectively, and in other instance may be described as a reference voltage signal and supply voltage signal.

The overall operation of the synchronous rectifier driver 102 will now be described in more detail with reference to FIGS. 3 and 4. FIG. 3 is a graph of the gate drive signal (i.e., the gate-to-source voltage) as a function for the SR switch of FIG. 2 (i.e., for the SR switches SR1 and SR2 of FIG. 1). FIG. 4 is a signal diagram illustrating the overall operation of the synchronous rectifier driver 102 of FIG. 2 in the first, second, third and fourth regions of the graph of FIG. 3. The graph of FIG. 3 is analogous to the gate charge curve for a MOSFET SR switch previously described, as will be appreciated by those skilled in the art. Recall, the SR switch is a power MOSFET in the example embodiments described in the present application. In FIG. 3, a region R1 corresponds to the sub threshold region, while a region R2 corresponds to the saturation or Miller plateau region, and a region R3 corresponds to the linear region. A final region R4 is designated a peak drive region and corresponds to the region in which the programmable clamp circuit 204 limits or clamps the GD signal to a second gate drive threshold VGD2, which is the maximum gate drive voltage applied to the gate of the SR switch, as will be described in more detail below.

Figure 4:
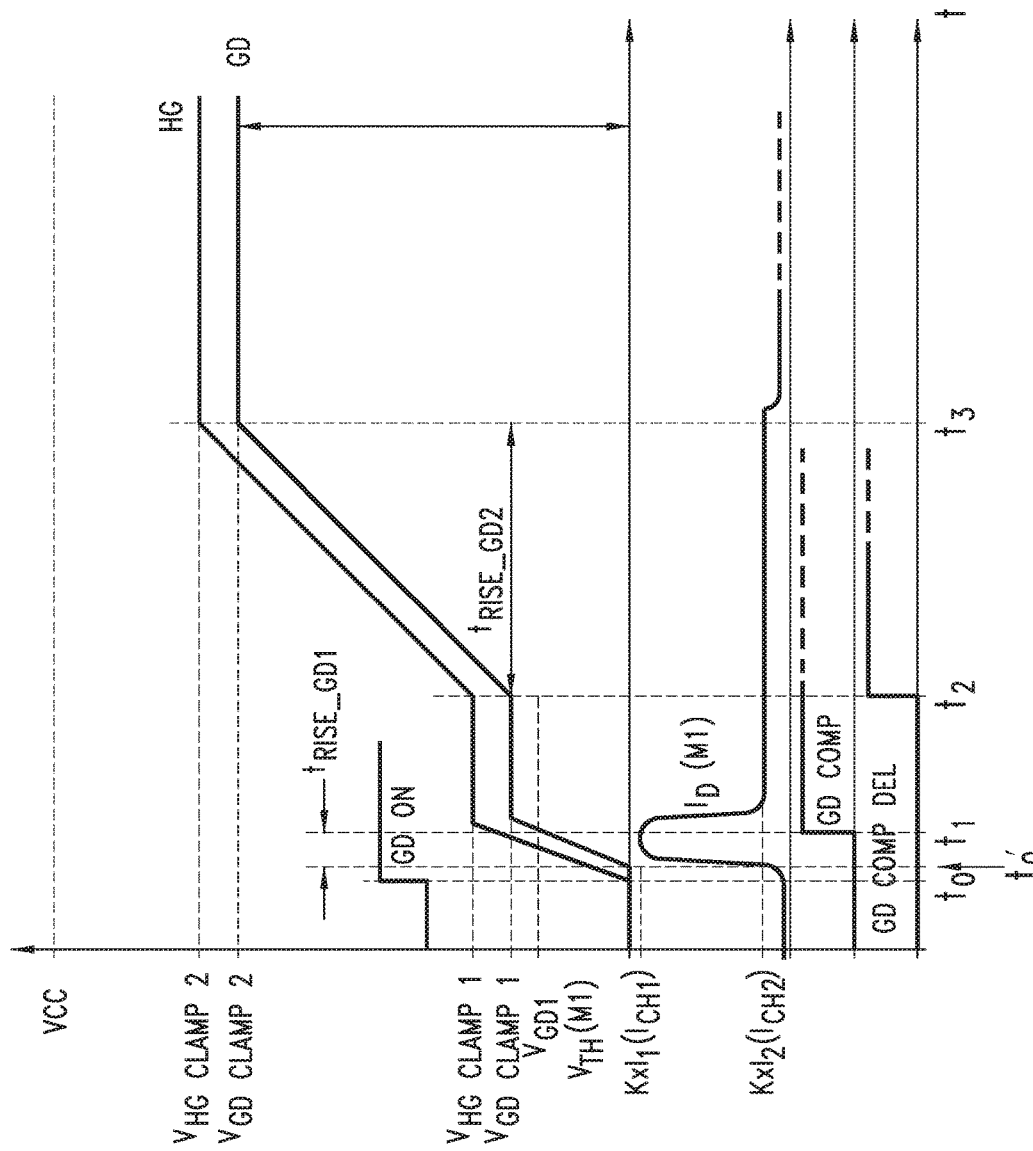
FIG. 4 is a signal diagram illustrating the overall operation of the synchronous rectifier driver of FIG. 2 in the first, second, third and fourth regions of the graph of FIG. 3.

Referring now to FIG. 4, the operation of the synchronous rectifier driver 102 in generating the GD signal along with several other signals generated during operation of the synchronous rectifier driver will now be described in more detail. In FIG. 4, the horizontal axis represents time while the vertical axis represents voltage for all signals except for the drain current ID through the NMOS transistor M1. Before a time t0, the GD_ON signal is inactive low, indicating the SR switch is turned. Referring to FIG. 2, the inactive low GD_ON signal means the $\overline{GD\_ON}$ signal is high, turning ON the transistor M2 to thereby couple the GD node of the SR switch to the reference node GND and turn OFF the SR switch. Also before the time t0 the gate drive comparator signal GD_COMP signal is inactive low and the same is true for the delayed gate drive comparator signal GD_COMP_DEL (not shown in FIG. 4). The HG node is also inactive low before a time t0, turning OFF the NMOS transistor M1.

At the time t0, the GD_ON signal goes active high, indicating the synchronous rectifier driver 102 has determined the SR switch (SR1 or SR2 of FIG. 1) is to be activated or turned ON. In response to the GD_ON signal going active high, the $\overline{GD\_ON}$ signal goes inactive low, turning OFF the NMOS transistor M2 coupling the GD node to the GND node to turn OFF the SR switch. Also in response to the GD_ON signal going active high at time t0, the programmable current generator 200 supplies a first current ICH1 as the programmable charge current ICH to charge the HG node and thereby start driving the HG signal on this node high. This is seen in FIG. 4 as the HG signal begins increasing at just after the time t0. The HG signal increases in response to the first charge current ICH1 until, at a time t'$_0$ the HG signal reaches the threshold VTH of the NMOS transistor M1. Thus, at the time t'$_0$ the NMOS transistor M1 starts turning ON and a drain current ID is provided to through this transistor to start charging the GD node and thereby driving the GD signal active high. This is seen in Figure at the GD signal begins increasing at just after the time t'$_0$ as the NMOS transistor M1 turns ON responsive to the HG signal.

The HG signal continues increasing after the time t'$_0$ to drive the NMOS transistor M1, which provides the ID current to drive the GD signal high as the HG signal increases. The first charge current ICH1 provided by the programmable current generator 200 at this point is sufficient to ensure the NMOS transistor M1 provides the current ID sufficient to drive the GD signal to the first gate drive threshold VGD1 within a first target rise time vgd of the GD signal. As seen in FIG. 4, the first target rise time $t_{RISE\_GD1}$ corresponds to a time interval from the time t0 until a time t1 at which the GD signal reaches the first gate drive threshold VGD1. During the time $t_{RISE\_GD1}$ of the GD signal, the current ID provided by the NMOS transistor M1 has a maximum value related to the first charge current ICH1 provided by the programmable current generator 200, as will be discussed in more detail below with reference to FIGS. 6A and 6B. This maximum value is indicated as the first charge current ICH1=(K×I1) in FIG. 4, as will also be discussed in more detail below reference to FIGS. 5, 6A and 6B.

At the time t1, the HG signal reaches the first gate drive threshold VGD1 and in response to the HG signal reaching this threshold the comparator 206 drives the GD_COMP signal active high, as seen in FIG. 4. In response to the GD_COMP signal going active high, the programmable current generator 200 terminates providing the programmable charge current ICH equal to the first charge current ICH1 and begins providing the programmable charge current ICH that is equal to the second charge current ICH2. In response to the current generator 200 providing the second charge current ICH2 to charge the HG node and thereby drive the HG signal, the ID current supplied by the NMOS transistor M1 has new value that is related to this second charge current. This new programmable value is indicated as the second charge current ICH2=(K×I2) in FIG. 4, as will be discussed in more detail below reference to FIGS. 5, 8A and 8B.

As seen in FIG. 4, at just after the time t1 the HG signal reaches the first clamped threshold VHG_CLAMP1 at which the fast clamp circuit 202 (FIG. 1), which is active at this point, clamps the HG signal. By the fast clamp circuit 202 clamping the HG signal at the first clamped threshold VHG_CLAMP1, the GD signal driving the SR switch is clamped at a first clamped threshold VGD_CLAMP1. The VGD_CLAMP1 threshold is less than the VHG_CLAMP1 threshold by the threshold voltage VTH of the NMOS transistor M1, as will be discussed in more detail below. This operation continues after the time t1, with the HG and GD signals being clamped at the thresholds VHG_CLAMP1 and VGD_CLAMP1, respectively, and the programmable current generator 200 providing the second charge current ICH2 that causes the NMOS transistor M1 to provide the current ID to the node GD. This continues until a time t2, where the time interval from time t1 to t2 is a delay interval that functions to clamp the HG signal and thereby the GD signal at the clamp thresholds VHG_CLAMP1 and VGD_CLAMP1 over the plateau region R3 of the VGS curve of FIG. 3 for the SR switch.

At the time t2, the delayed gate drive comparator signal GD_COMP_DEL goes active high in response to the GD_COMP signal going active high at time t1. Two things occur in the synchronous rectifier driver 102 in response to the GD_COMP_DEL signal going active at the time t2. First, when the GD_COMP_DEL signals goes active, the $\overline{GD\_COMP\_DEL}$ signal goes inactive, turning OFF at the fast clamp circuit 202. Second, in response to the GD_COMP_DEL signal going active, the programmable clamp circuit 204 is activated. Thus, the programmable clamp circuit 204 turns ON and the fast clamp circuit 202 turns OFF at time t2. As a result, the HG signal is no longer clamped at the first clamped threshold VHG_CLAMP1 and the HG signals starts increasing after the time t2 as the programmable current generator provides the second charge current ICH2 to charge the HG node. The GD signal increase accordingly as the HG signal increases, as seen in FIG. 4. The value of the second charge current ICH2 determines the rate at which the HG signal increases after the time t2 and thereby determines the rate at which the GD signal increases as well during this time. The value of the second charge current ICH2 is programmed to a value via the GD_CTRL<n:0> signal (FIG. 1) so that the GD signal has a second target rise time $t_{RISE\_GD2}$ from the time t2 until a time t3. At the time t3, the programmable clamp circuit 204 clamps the HG signal at the second clamped threshold VHG_CLAMP2 and thereby clamps the GD signal at the second clamped threshold VGD_CLAMP2. The VGD_CLAMP2 threshold is the maximum voltage for the GD signal that the synchronous rectifier driver 102 applies to the SR switch. The specific value of the VGD_CLAMP2 threshold is controllable via the VD CTRL<n:0> signal and may have a maximum value equal to the supply voltage VCC less the threshold voltage VTH of the NMOS transistor M1.

In this way, the programmable current generator 200 and the programmable clamp circuit 204 operate in combination to control the GD signal over the tRISE_GD2 interval from t2-t3. The programmable current generator 200 sets the value of the second charge current ICH2 to thereby set the rate of change of the GD signal such that the GD signal reaches the VGD_CLAMP2 threshold after the tRISE_GD2 interval from t2-t3. The gate drive current rise signal GD_RISE<n:0> supplied to the programmable current generator 200 sets the value of the second charge current ICH2 while the gate drive programmable control signal GD_CTRL<n:0> supplied to the programmable clamp circuit 204 sets the value of the VGD_CLAMP2 threshold. This allows the synchronous rectifier driver 102 to supply the value of current ICH2 that results in the GD signal reaching the VGD_CLAMP2 threshold at the desired tRISE_GD2 time for controlling the turn ON of the SR switch.

Figure 5:
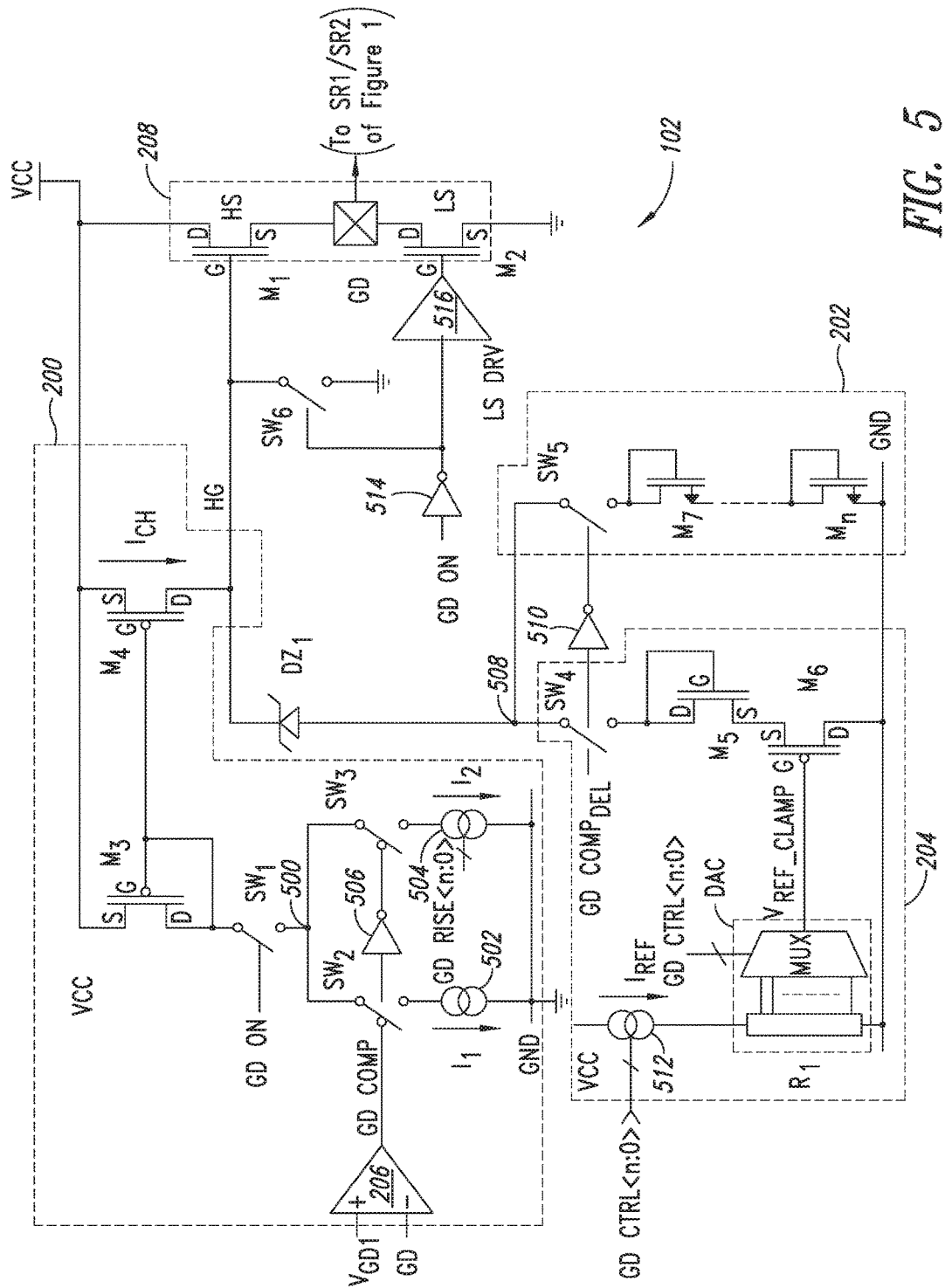
FIG. 5 is a more detailed schematic of one embodiment of the synchronous rectifier driver of FIG. 2.

FIG. 5 is a more detailed schematic of one embodiment of the synchronous rectifier driver 102 of FIG. 2. The same reference descriptors are used for components in FIG. 5 that were used for those same components in FIGS. 1 and 2. In the embodiment of FIG. 5, the programmable current generator 200 includes a current mirror formed by a PMOS transistor M3 coupled between the supply voltage node VCC and the HG node. The gate of the PMOS transistor M3 is coupled to the gate of a diode-coupled PMOS transistor M4 which is, in turn, coupled in series with a first switch SW1 between the supply voltage node VCC and a first switching node 500. The first switch SW1 is closed or turned ON responsive to the GD_ON signal being active (i.e., when the SR switch is to be turned ON) and is open or turned OFF responsive to the GN_ON signal being inactive (i.e., SR switch to be turned OFF).

The programmable current generator 200 further includes a second switch SW2 coupled in series with a constant current generator 502 that generates a fixed or constant current vI1. The switch SW2 and first current generator 502 are coupled between the first switching node 500 and the reference node GND and in parallel with a third switch SW3 and a variable current generator 504 that receives the gate drive current drive signal GD_RISE<n:0>. The variable current generator 504 generates a variable current I2 having a value that is determined by the value of the GD_RISE<n:0> signal. The current I1 sets the value of the first charge current ICH1 and the current I2 sets the value of the second charge current ICH2 provided by the programmable current generator 200, as will be described in more detail below. The GD_COMP signal generated by the comparator 206 is applied directly to control the switch SW2 and is applied through an inverter 506 to supply the complement of this signal to control the switch SW3. Note the switches SW2 and SW3 are active low switches, meaning that the each switch SW2, SW3 is turned ON or closed responsive to the applied control signal being low and is turned OFF or open responsive to the control signal being high in the embodiment of FIG. 5.

In the embodiment of the synchronous rectifier driver 102 of FIG. 5, the fast clamp circuit 202 includes a switch SW5 coupled in series with a number of diode-coupled NMOS transistors M7-M$_n$ coupled in series between a second switching node 508 and the reference node GND. A Zener diode DZ1 is coupled between the second switching node 508 and the HG node so that when the fast clamp circuit 202 is activated, the first clamped threshold VHG_CLAMP1 on the HG node is given by VHG_CLAMP1=VZ1+(N×VGS) where N is the number of diode-coupled NMOS transistors M7-Mn, VGS is the gate to source voltage of each of these diode-coupled NMOS transistors, and VZ1 is the threshold voltage of the leader diode DZ1. In this way, the number N of series connected diode-coupled NMOS transistors M7-Mn is selected to obtain the desired value for the first clamped threshold VHG_CLAMP1. The $\overline{GD\_COMP\_DEL}$ signal, which is the complement of the delayed version of the GD_COMP signal from the comparator 206, controls the switch SW5. The GD_COMP_DEL signal is supplied through an inverter 510 to provide the $\overline{GD\_COMP\_DEL}$ signal that controls the switch SW5. The fast clamp circuit 202 is activated when the $\overline{GD\_COMP\_DEL}$ signal is active high (i.e., when the GD_COMP_DEL signal is inactive low) to thereby close the switch SW5 and couple the transistors M7-Mn in series with the diode DZ1 to limit or clamp the HG node at the first clamped threshold VHG_CLAMP1.

The programmable clamp circuit 204 includes a switch SW4 coupled in series with a diode-coupled NMOS transistor M5 and a PMOS transistor M6 between the second switching node 508 and the reference node GND. The GD_COMP_DEL signal closes the switch SW4 when active high and opens the switch when inactive low. A reference clamp signal VREF_CLAMP is supplied to the gate of the PMOS transistor M6 to set the value of the second clamped threshold VHG_CLAMP2 on the HG node when the programmable clamp circuit 204 is activated. The reference clamp signal VREF_CLAMP sets the current through the PMOS transistor M6 and the diode-coupled Ptransistor M5 to thereby set the voltage on the second switching node 508 when the switch SW4 is closed. The voltage on the second switching node 508 determines the value of the second clamped threshold VHG_CLAMP2, where VHG_CLAMP2=VZ1+VGSM5+VGSM6+VREF_CLAMP. The transistor M5 is matched with the NMOS transistor M1 driving the HG node such that the characteristics of these two transistors can be considered the same, as will be appreciated by those skilled in the art. The value of the voltage on the node 508 is determined to ensure the GD signal driving the SR switch has the desired value, where if the GD signal is designated VGD then the desired value for this signal is VGD=VHG_CLAMP2−VGSM1. So the desired value for the VHG_CLAMP2 signal on the HG node is VHG_CLAMP2=VGD+VGSM1, and the VREF_

CLAMP signal is set to ensure the voltage on the node 508 has the required value to set the VHG_CLAMP2 signal at this desired value.

The embodiment of the programmable clamp circuit 204 of FIG. 5 illustrates two possible approaches for generating the reference clamp signal VREF_CLAMP. These approaches would be alternately utilized. In the first approach, a programmable current generator 512 receives the gate drive programmable control signal GD_CTRL<n:0> to set the value of a variable reference current IREF supplied by the programmable current generator. This variable reference current IREF is supplied through a fixed resistor R1 to thereby generate the reference clamp signal VREF_CLAMP across the resistor. In the second approach, the current generator 512 is a constant current generator that supplies the reference current IREF having a constant value. The resistor R1 in this approach is a resistive ladder network that is part of a resistive digital-to-analog converter (DAC). The constant reference current IREF is supplied through the resistive ladder network R1 in this approach to thereby generate a plurality of voltages on nodes of the resistive ladder network, as will be understood by those skilled in the art. The resistive ladder network R1 is coupled to a multiplexer MUX that receives the gate drive programmable control signal GD_CTRL<n:0> to thereby provide the voltage on a corresponding node in the resistive ladder network as the reference clamp signal VREF_CLAMP supplied to the PMOS transistor M6. The Zener diode DZ1 may be considered to be part of either or both of the fast clamp circuit 202 and the programmable clamp circuit 204.

The synchronous rectifier driver 102 further includes a switch SW6 coupled across the HG and this switch is driven by the GD_ON signal applied through an inverter 514. Thus, when the GD_ON signal is inactive low, the inverter 514 drives its output high to close the switch SW6, coupling the HG node to the GND node to turn OFF the SR switch. A low-side driver 516 drives a low-side NMOS transistor driving the GD node in response to the $\overline{GD\_ON}$ signal from the inverter 514 (i.e., the complement of the GD_ON signal). Thus, when the $\overline{GD\_ON}$ signal is active high, indicating the SR switch is to be turned OFF, the low-side driver 516 turns the transistor M2 to drive the GD node to the reference node GND and turn OFF the SR switch.

The overall operation of the programmable current generator 200 will now be described with reference to FIG. 5 and the signal diagram of FIG. 4. Initially, before the time t0 the GD_ON signal is inactive low. The inactive low GD_ON signal opens the switch SW1 so the programmable current generator 200 provides no charge current ICH to charge the HG node. Also in response to the inactive low GD_ON signal, the inverter 514 supplies a high output signal to turn ON the switch SW6, coupling the HG node to the reference node GND and thereby turning OFF the NMOS transistor M1. The high output signal from the inverter 514 is also provided to the low-side driver 516 which, in turn, provides a high output to turn ON the NMOS transistor M2 and coupled the GD node to the reference node GND to turn off the SR switch (not shown in FIG. 5). Before the time t0 the comparator 206 drives the GD_COMP signal inactive low, which turns ON the switch SW2 and OFF the switch SW3. Similarly, the switches SW4 and SW5 are turned OFF and ON, respectively, responsive to the inactive low GD_COMP_DEL signal and the complement of this signal (i.e., active high control signal in this case) applied to the switch SW5 by the inverter 510.

At the time t0 the GD_ON signal goes active high, turning ON the switch SW1 and turning OFF the switch SW6. When the GD_ON signal goes active high the inverter drives its output low which causes the driver 516, in turn, to drive its output low and turn OFF the NMOS transistor M2. The transistors M3 and M4 in the programmable current generator 200 function as a current mirror, and when the switch SW1 closes the current I1 of the current generator 502 flows through the diode-coupled transistor M3 and switches SW1 and SW2. Based on the sizes of the transistors M3 and M4, the current I1 through the transistor M3 is then mirrored in the transistor M4 as the charge current ICH, as will be understood by those skilled in the art. Thus, at this point the charge current ICH equals the first charge current ICH1 and this first charge current charges the HG node. This first charge current ICH1 is equal to (K×I1) as mentioned above and as shown in FIG. 4, where K is a parameter based on the ratio of the size of the transistor M4 to the size of the transistor M3. At the time t'$_0$, the HG signal reaches the threshold voltage VTH of the NMOS transistor M1, which starts turning ON to thereby drive the GD node high as seen in FIG. 4.

At the time t1, the GD signal reaches the first gate drive threshold VGD1, causing the comparator 206 to drive the GD_COMP signal active high. In response to the GD_COMP signal going high, the switch SW2 turns OFF while the inverter 506 drives its output low to turn ON the switch SW3. The switch SW1 remains closed at this point such that the charge current ICH is now determined by the variable current I2 generated by the variable current generator 504 based on the gate drive current rise signal GD_RisE<n:0>. Thus, the charge current ICH at this is equal to the second charge current ICH2 discussed above and is given by (K×I2). This second charge current ICH2 results in the drain current ID provided by the NMOS transistor M1 decreasing to a new lower value just after the time t2 as seen in FIG. 4. Before the time t2, however, the GD_COMP_DEL signal (i.e., the delayed version of the GD_COMP signal) remains inactive low so that at this point the fast clamp circuit 202 continues clamping the second switching node 508 so that the HG node is maintained at the first clamped threshold VHG_CLAMP1.

When the GD_COMP_DEL signal goes active high at the time t2, the switch SW4 in the programmable clamp circuit 204 closes and at the same time this signal is applied through the inverter 510 to open the switch SW5. As a result of the switch SW5 opening, the fast clamp circuit 202 no longer clamped the voltage on the second switching node 508 but instead this voltage on the second switching node is now clamped by the programmable clamp circuit 204 since the switch SW4 is now closed. This results in the higher second clamped threshold VHG_CLAMP2 for the HG signal on the HG node and this signal increases after time t2 in response to the ICH2 current charging this node. As the HG signal increases the GD signal driving the NMOS transistor M1 also increases as seen in FIG. 4. This interval from the time t2 to the time t3 is the second target rise time $t_{RISE\_GD2}$ as previously discussed and is selected to drive the SR switch (not shown) based on the ICH2 current having a value determined by the current I2 which is set by the GD_RISE<n:0> signal.

The second clamped threshold VHG_CLAMP2 for the HG signal is reached at the time t3 and thus the programmable clamp circuit 204 clamps the HG signal at this threshold after the time t3. Clamping the HG signal at the second clamped threshold VHG_CLAMP2 clamps the GD signal driving the SR switch at the second clamped threshold VGD_CLAMP2 as seen in FIG. 4. The GD_RISE<n:0> signal is set to provide the desired ICH2 during the tRISE_GD2 interval and the GD_CTRL<n:0> signal set control the value of the VHG_CLAMP2 threshold and thereby control the threshold VGD_CLAMP2 at which the GD signal driving the SR switch is clamped to define the tRISE_GD2 interval. When the synchronous rectifier driver 102 determines the SR switch is to be turned OFF (i.e., when, the DVS signal indicates the current flowing through the SR switch is approximately zero), the GD_ON signal goes inactive low and the synchronous rectifier driver 102 of FIG. 5 again operates as previously described for before the time t0 in FIG. 4.

Figure 6A:
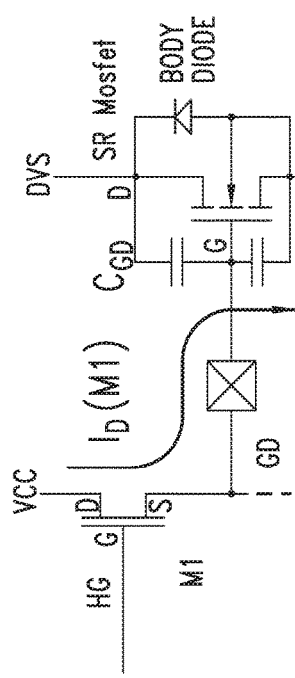
FIG. 6A is a functional diagram and FIG. 6B a signal diagram illustrating the operation of the programmable current generator in the synchronous rectifier driver of FIG. 5 to realize a first target rise time for the gate drive signal driving the SR switch of FIG. 2.
Figure 6B:
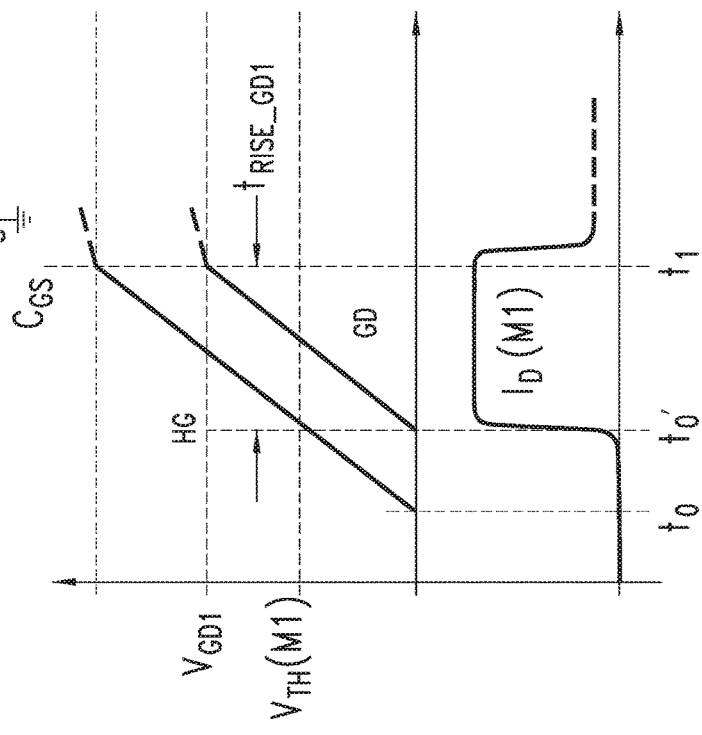

FIG. 6A is a functional diagram and FIG. 6B a signal diagram illustrating the operation of the programmable current generator 200 in the synchronous rectifier driver 102 of FIG. 5 in driving the gate of the high-side transistor of the output driver 208 (i.e., NMOS transistor M1) and thereby by gate of the SR switch to realize the to realize a first target rise time tRISE_GD1 for the gate drive signal GD driving the SR switch. The ICH1 current charges the HG node starting at time t0 and at time $t'_0$ reaches the threshold voltage VTH of the NMOS transistor M1 which starts turning ON to charge the GD node with the drain current ID provided by the NMOS transistor M1. At the time t1 the GD node reaches the VGD1 threshold and the charge current ICH provided by the programmable current generator 200 switches from the first charge current ICH1 to the second charge current ICH2, causing the drain current ID provided by the NMOS transistor M1 to decrease to the new lower level provided after the time t1. FIG. 6A shows the gate-to-source capacitance CGS and the gate-to-drain capacitance CGD of the SR switch that must be charged by the drain current ID supplied by the NMOS transistor M1. As seen in FIG. 6B, the drain current ID provided by the NMOS transistor M1 to charge the GD node and drive the GD signal high has a maximum value during the first target rise time tRISE_GD1.

Figure 7A:
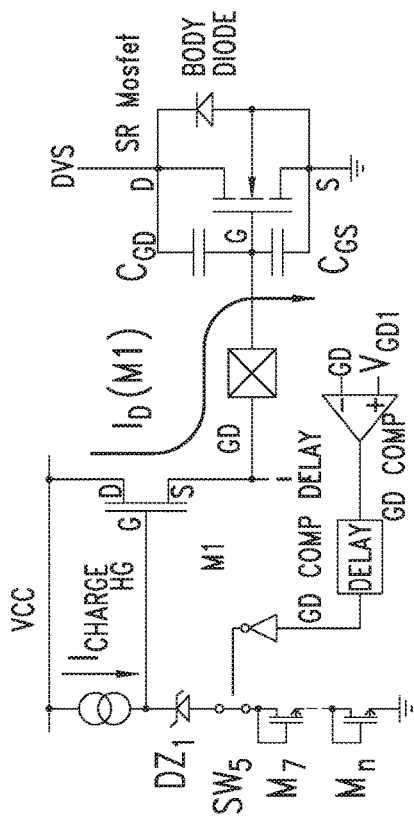
FIG. 7A is a functional diagram and FIG. 7B a signal diagram illustrating the operation of the synchronous rectifier driver of FIG. 5 in changing the charge current supplied by the programmable current generator and changing the value of the clamped voltage on the gate drive node during the plateau region for the gate drive signal driving the SR switch of FIG. 2.
Figure 7B:
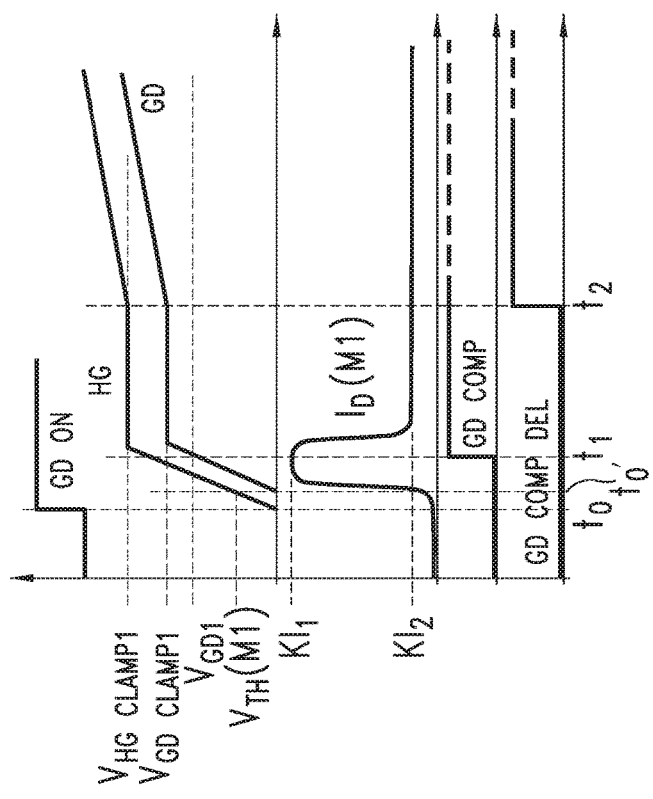

FIG. 7A is a functional diagram and FIG. 7B a signal diagram illustrating the operation of the synchronous rectifier driver 102 of FIG. 5 in changing the charge current ICH supplied by the programmable current generator 200 and the clamped voltage on the GD node during the plateau region for the gate drive signal GD on the node GD driving the SR switch. This region corresponds to the interval from time t1 to the time t2 in FIG. 7B. As previously described, at the time t1 the GD node reaches the VGD1 threshold and the GD_COMP signal goes high, opening the switch SW2 and closing switch SW3 so the charge current ICH provided by the programmable current generator 200 switches from the first charge current ICH1 to the second charge current ICH2. In one embodiment, the threshold VGD1=(VGD_CLAMP1−0.5 V) where VGD_CLAMP1=(VHG_CLAMP1−VGSM1)=(VZ1+N×VGS−VGSM1) and is equal to approximately 5-6 volts. The new ICH2 current causes the drain current ID provided by the NMOS transistor M1 to decrease to the new lower level provided after the time t1 as seen in FIG. 7B. After the delay time equal to the interval from t1 to t2, the GD_COMP_DEL signal goes active high, closing switch SW4 and opening switch SW5. The fast clamp circuit 202 turns OFF or is deactivated when switch SW5 opens while the programmable clamp circuit 204 is activated and now clamps the voltage on the second switching node 508 so that the clamped voltage on the HG node increases from the lower threshold VHG_CLAMP 1 to the higher threshold VHG_CLAMP2 at the time t2. As a result, the HG signal and GD signal driving the SR switch begin increasing after the time t2 as the HG is now allowed to increase to the higher clamped value VHG_CLAMP2.

Figure 8A:
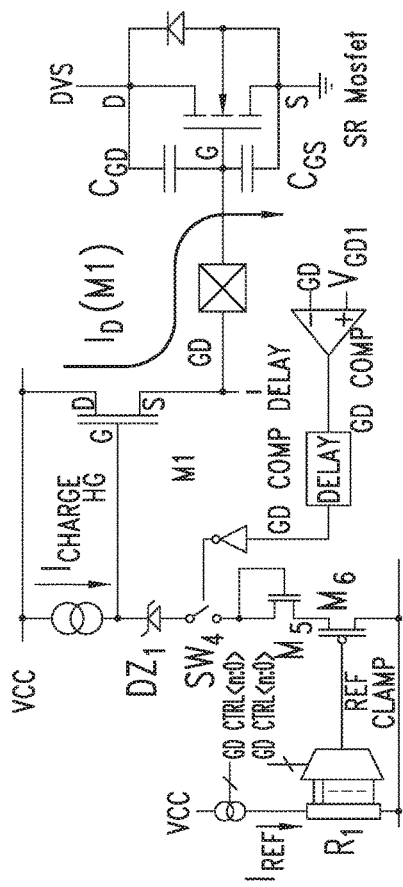
FIG. 8A is a functional diagram and FIG. 8B a signal diagram illustrating the operation of the synchronous rectifier driver of FIG. 5 in the linear region for the gate drive signal driving the SR switch and in clamping the gate drive signal at a second gate drive threshold having a programmable value.
Figure 8B:
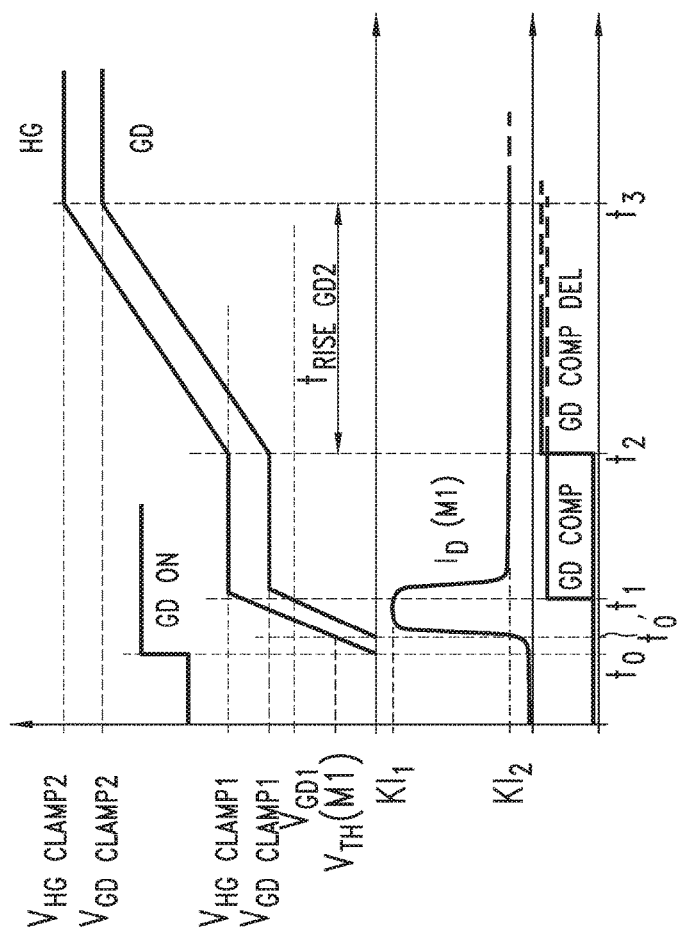

FIG. 8A is a functional diagram and FIG. 8B a signal diagram illustrating the operation of the synchronous rectifier driver 102 of FIG. 5 in the linear region for the gate drive signal GD driving the SR switch and in clamping the gate drive signal at the second gate drive threshold VGD_CLAMP2 having a programmable value. At the time t2, the current generator 504 provides a current I2 causing the transistor M4 to supply the second charge current ICH2 to the HG node and the NMOS transistor M1 to supply the drain current ID to charge the GD node, which can now increase along with the voltage on the HG node since the programmable clamp circuit 204 is now active and clamps the voltage on the HG node to the second gate drive threshold VGD_CLAMP2 having a value set by the reference clamp signal VREF_CLAMP.

Figure 3:
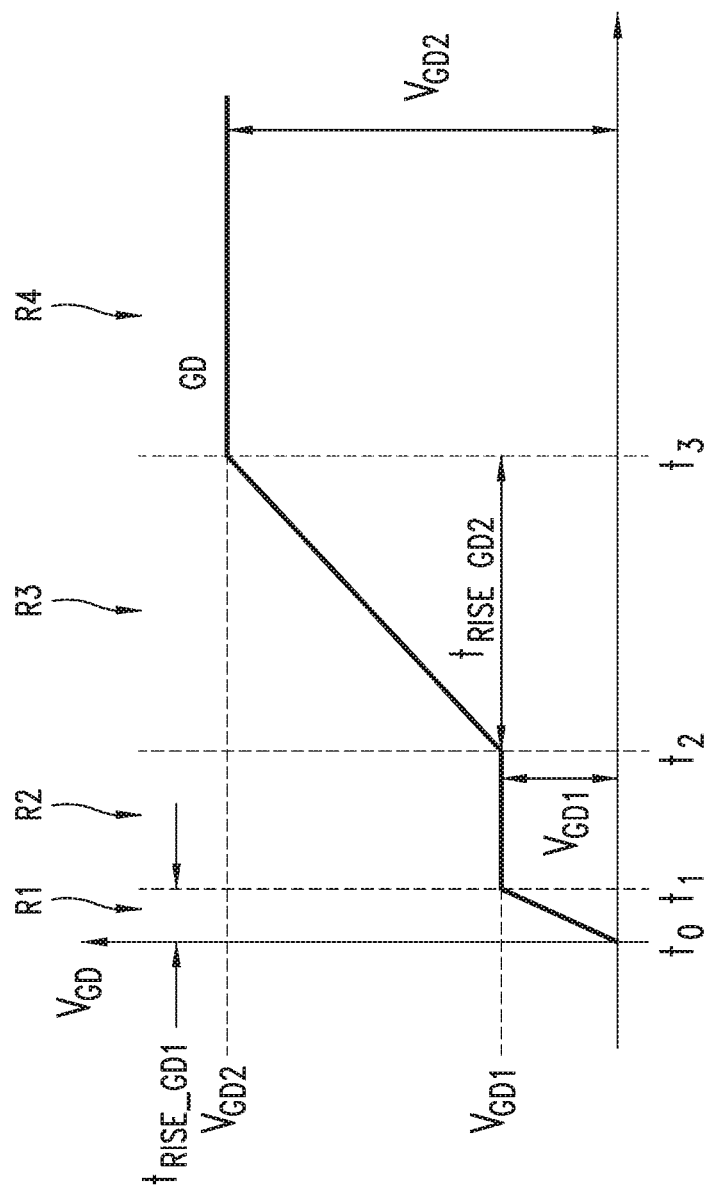
FIG. 3 is a graph of the gate drive signal as a function of time of the synchronous rectifier switches of FIG. 1.

The second gate drive threshold VGD_CLAMP 2 corresponds to the second gate drive threshold VGD2 previously mentioned with reference to FIG. 3. The second gate drive threshold VGD_CLAMP2/VGD2 is programmable through the VREF_CLAMP signal as set by the GD_CTRL<n:0> signal. Recall, the GD_CTRL<n:0> signal is set to the desired value to thereby cause the DAC to set the VREF_CLAMP signal at the proper value to realize the desired VGD_CLAMP2 threshold value. The value of the VGD_CLAMP2/VGD2 signal can be set through the GD_CTRL<n:0> signal to a desired value between the first gate drive threshold VGD1 and the supply voltage VCC. This is in contrast to conventional driver circuits, which drive the gate drive signal GD driving the SR switch to the supply voltage VCC as quickly as possible in the linear region. Limiting the VGD_CLAMP2/VGD2 signal to value less than the supply voltage reduces electromagnetic interference generated by the synchronous rectifier driver 102 and also reduces noise on the supply voltage VCC due to operation of the synchronous rectifier driver.

The linear region in FIG. 8B corresponds to the interval from time t2 to time t3, which is the second target rise time $t_{RISE\_GD2}$ as previously discussed. The charge current ICH2 and second clamped threshold VHG_CLAMP2 are set to values so the second target rise time $t_{RISE\_GD2}$ has the desired value for driving the SR switch. After operation in the linear region, namely after the time t3 in FIG. 8B, the programmable clamp circuit 204 clamps the HG signal at the VHG_CLAMP2 threshold and thereby the GD signal driving the SR switch at the VGD_CLAMP2 threshold. The second target rise time $t_{RISE\_GD2}$ is approximately equal to [$C_{GM1}$/ICH2 (VHG_CLAMP1−VHG_CLAMP2)], where $C_{GM1}$ is the capacitance at the gate of the NMOS transistor M1 driving the GD node.

Figure 9:
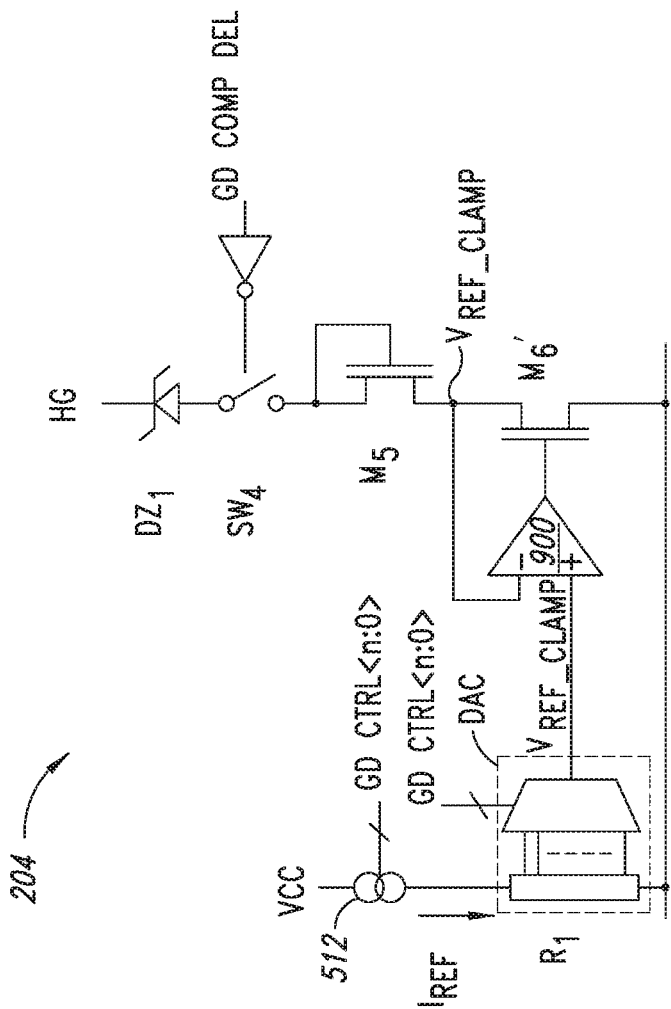
FIG. 9 is a schematic illustrating another embodiment of circuitry in the programmable clamp circuit of FIG. 5 for generating a reference clamp voltage to thereby set a second clamp value for the gate drive signal applied to the SR MOSFET during the fourth region of FIG. 3.

FIG. 9 is a schematic illustrating another embodiment of circuitry in the programmable clamp circuit 204 of FIG. 5 for generating the reference clamp voltage VREF_CLAMP to thereby set the value for the VHG_CLAMP2 threshold and thereby the value of the VGD_CLAMP 2 threshold at which the gate drive signal GD driving the SR switch is clamped during the operation of the synchronous rectifier driver 102 in the fourth region R4 of FIG. 3. In FIG. 9, the PMOS transistor M6 of FIG. 5 is replaced with an NMOS transistor M'6 and an operational amplifier 900 inserted to drive the gate of the NMOS transistor based on the VREF_CLAMP voltage from the DAC. In operation, the amplifier 900 drives the gate of the NMOS transistor M'6 so that the voltage at the drain of this transistor, which is coupled to the inverting-input of the amplifier, is equal to the VREF_CLAMP voltage. The embodiment of FIG. 9 may provide better accuracy in generating the required VREF_CLAMP voltage at the drain of the transistor M'6 to set the VHG_CLAMP2 threshold at the desired value.

Figure 10:
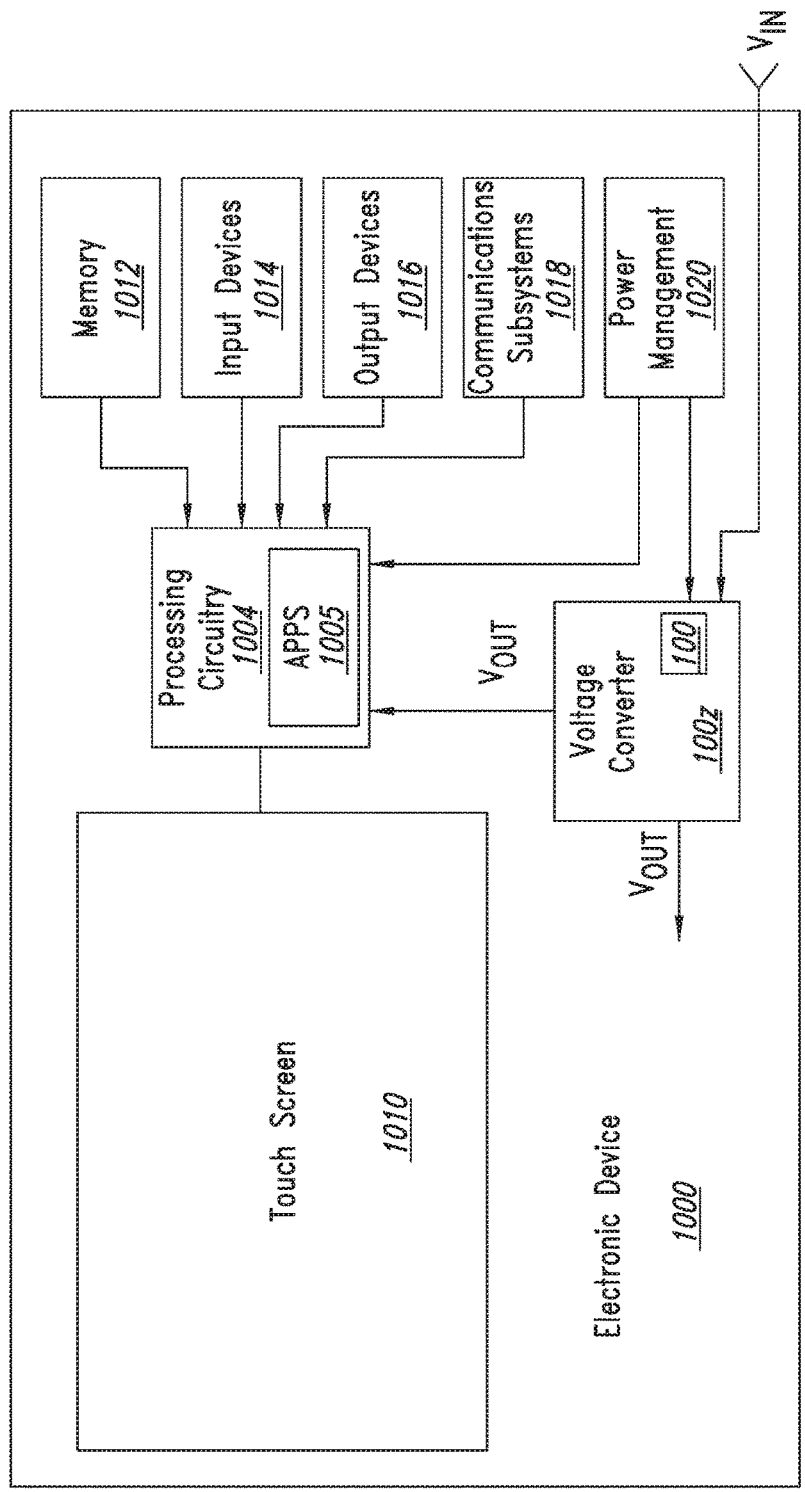
FIG. 10 is a functional block diagram of an electronic device including a voltage converter such as the LLC resonant converter of FIG. 1 containing the synchronous rectifier driver of the embodiments of FIGS. 2-9 according a further embodiment of the present disclosure.

FIG. 10 is a functional block diagram of an electronic device 1000 including a voltage converter 1002, such as the LLC resonant converter 100 of FIG. 1, which contains the synchronous rectifier driver 102 of any of the embodiments of FIGS. 2-9 according a further embodiment of the present disclosure. The electronic device 1000 in the example embodiment of FIG. 11 includes processing circuitry 1004 that controls the overall operation of the electronic device 1000 and also executes applications or "apps" 1006 that provide specific functionality for a user of the electronic device. In operation, the voltage converter 1002 generates an output voltage Vout from an input voltage VIN supplied to the electronic device 1000. The input voltage VIN may be an AC voltage that is then rectified and supplied to the LLC resonant converter 100 in the voltage converter 1002 or may be a DC voltage from an external power supply (not shown in FIG. 10. The electronic device 1000 may be any type of electronic device, such as a smart phone, a tablet computer, a laptop computer, and so on.

A power management subsystem 1008 of the electronic device 1000 is coupled to the processing circuitry 1004 and would typically include a battery for powering the electronic device, and also control circuitry for controlling power-related operating modes of the device such as charging of the battery, power-savings modes, and so on. The output voltage Vout generated by the voltage converter 1002 would typically be supplied to the power management subsystem 1008 and other components in the electronic device 1000 as required. The electronic device 1000 further includes a video component such as a touch screen 1010 with a touch display (not shown) such as a liquid crystal display (LCD) and a touch panel (not shown) attached to or formed as an integral part of the touch display. In operation, the touch screen 1010 senses touches of a user of the electronic device 100 and provides sensed touch information to the processing circuitry 1004 to thereby allow the user to interface with and control the operation of the electronic device. The processing circuitry 1004 also controls the touch screen 1010 to display desired visual content on the touch display portion of the touch screen.

The electronic device 1000 further includes data storage or memory 1012 coupled to the processing circuitry 1004 for storing and retrieving data including the apps 1006 and other software executing on the processing circuitry and utilized by the electronic device 1000 during operation. Examples of typical types of memory 1012 include solid state memory such as DRAM, SRAM and FLASH, solid state drives (SSDs), and may include any other type of memory suited to the desired functionality of the electronic device 1000 including digital video disks (DVDs), compact disk read-only (CD-ROMs), compact disk read-write (CD-RW) memories, magnetic tape, hard and floppy magnetic disks, tape cassettes, and so on.

Input devices 1014 are coupled to the processing circuitry 1004 and may include a keypad, whether implemented through the touch screen 1010 or separately, a pressure sensor, accelerometer, microphone, keyboard, mouse, digital camera to capture still and video images, and other suitable input devices. Output devices 1016 are coupled to the processing circuitry 1004 and may include, for example, audio output devices such as a speaker, printer, vibration device, and so on. The input devices 1014 and output devices 1016 collectively may include other types of typical communications ports for the electronic device 1000, such as USB ports, HDMI ports, and so on. The electronic device 1000 further includes communications subsystems 1018 coupled to the processing circuitry 1004 and which may include Wi-Fi, GPS, cellular and Bluetooth subsystems for providing the device with the corresponding functionality. The specific type and number of input devices 1014, output devices 1016, communications subsystems 1018, and even the specific functionality of the power management subsystem 1008 will of course depend on the specific type of the electronic device 1000.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A driver comprising a supply voltage node configured to receive a supply voltage and a gate drive node configured to be coupled to a gate node of a power transistor, the driver further including a high-side driver transistor coupled between the supply voltage node and the gate drive node and including a high side gate node, the driver configured to operate in a first mode to provide a first charge current to the high side gate node until a gate drive voltage on the gate drive node reaches a first gate drive threshold, the driver configured to then operate in a second mode responsive to the gate drive voltage reaching the first gate drive threshold to provide a second charge current to the high side gate node and to limit the gate drive voltage to a first clamped threshold, the driver further configured to operate in the second mode for a delay time after the gate drive voltage reaches the first gate drive threshold and after expiration of the delay time to operate in a third mode to provide the second charge current to the high side gate node and to limit the gate drive voltage to a second clamped threshold.

2. The driver of claim 1, wherein the second charge current provided to the high side gate node is less than the first charge current.

3. The driver of claim 1, wherein the second clamped threshold is greater than the first clamped threshold but less than the supply voltage, and wherein the driver is configured to receive a gate drive programmable control signal that sets the value of the second clamped threshold.

4. The driver of claim 1, wherein the driver is configured to operate in the first mode in response to an activation signal going active, and wherein the driver further comprises:
a low-side driver transistor coupled between a reference voltage node and the gate drive node and configured to receive on a low side gate node the complement of the activation signal; and
a comparator having a first input coupled to the gate drive node and a second input coupled to receive the first gate drive threshold, the comparator configured to generate a gate drive comparator signal that goes active responsive to the gate drive voltage reaching the first gate drive threshold.

5. The driver of claim 4 further comprising a programmable current generator coupled to the high side gate node of the high-side driver transistor and coupled to the comparator to receive the gate drive comparator signal, and configured to receive a gate drive current rise signal that sets the value of the second charge current and to receive the activation signal, the programmable current generator configured, responsive to the activation signal going active, to provide the first charge current to the high side gate node and configured, responsive to the gate drive signal reaching the first gate drive threshold, to provide the second charge current to the high side gate node.

6. The driver of claim 5 further comprising a fast clamp circuit coupled to the high side gate node, the fast clamp circuit configured during the second mode to limit the voltage on the high side gate node to a high side gate node first clamped threshold to thereby limit the gate drive voltage to the first clamped threshold, the fast clamp circuit further configured to be deactivated upon expiration of the delay time to stop limiting the voltage on the high side gate node.

7. The driver circuit of claim 6 further comprising a programmable clamp circuit coupled to the high side gate node, the programmable clamp circuit configured during the third mode to limit the voltage on the high side gate node to a high side gate node second clamped threshold to thereby limit the gate drive voltage to the second clamped threshold, the programmable clamp circuit configured to be activated upon expiration of the delay time and to be deactivated prior to expiration of the delay time.

8. The driver circuit of claim 7, wherein the programmable clamp circuit comprises a diode-coupled transistor that is matched to the high side driver transistor.

9. The driver of claim 1, wherein the driver is formed in an integrated circuit with the supply voltage node and gate drive node being pins of the integrated circuit and the power transistor being external to the integrated circuit.

10. A synchronous rectifier driver, comprising:
   a supply voltage node configured to receive a supply voltage;
   a first gate drive node configured to be coupled to a first gate node of a first power transistor and a second gate drive node configured to be coupled to the second gate drive node of a second power transistor;
   a first drive circuit configured to drive the first gate drive node and a second drive circuit configured to drive the second gate drive node, each of the first and second drive circuits including:
      a high-side driver transistor coupled between the supply voltage node and a corresponding gate drive node, and including a high side gate node; and
   wherein the drive circuit is configured to operate in a first mode to provide a first charge current to the high side gate node until a gate drive voltage on the corresponding gate drive node reaches a first gate drive threshold, the driver circuit configured to then operate in a second mode responsive to the gate drive voltage reaching the first gate drive threshold to provide a second charge current to the high side gate node and to limit the gate drive voltage to a first clamped threshold, the driver circuit further configured to operate in the second mode for a delay time after the gate drive voltage reaches the first gate drive threshold and after expiration of the delay time to operate in a third mode to provide the second charge current to the high side gate node and to limit the gate drive voltage to a second clamped threshold.

11. The synchronous rectifier driver of claim 10, wherein the synchronous rectifier driver is formed in an integrated circuit with the supply voltage node, first gate drive node, and second gate drive node each being a pin of the integrated circuit and the first and second power transistors being external to the integrated circuit.

12. The synchronous rectifier driver of claim 10, wherein the second charge current provided to each high side gate node is less than the first charge current.

13. The synchronous rectifier driver of claim 10, wherein the second clamped threshold is greater than the first clamped threshold but less than the supply voltage, and wherein each driver circuit is configured to receive a gate drive programmable control signal that sets the value of the second clamped threshold.

14. The driver of claim 10, wherein each of the first and second driver circuits is configured to operate in the first mode in response to an activation signal, and wherein each of the first and second drive circuits comprises:
   a low-side driver transistor coupled between a reference voltage node and the corresponding gate drive node and configured to receive on a low side gate node the complement of the activation signal;
   a comparator having a first input coupled to the gate drive node and a second input coupled to receive the first gate drive threshold, the comparator configured to generate a gate drive comparator signal; and
   a programmable current generator coupled to the high side gate node of the high-side driver transistor and coupled to the comparator to receive the gate drive comparator signal, and configured to receive a gate drive current rise signal that sets the value of the second charge current and to receive the activation signal, the programmable current generator configured to provide the first and second charge currents to the high side gate node.

15. The synchronous rectifier driver of claim 14 wherein each of the first and second drive circuits further comprises a fast clamp circuit coupled to the high side gate node, the fast clamp circuit configured during the second mode to limit the voltage on the high side gate node to a high side gate node first clamped threshold to thereby limit the gate drive voltage to the first clamped threshold, the fast clamp circuit further configured to be deactivated upon expiration of the delay time to stop limiting the voltage on the high side gate node.

16. A method, comprising:
   providing a first charge current to a high side control node of a high-side driver transistor coupled between a supply voltage node configured to receive a supply voltage and a control drive node;
   sensing a control drive voltage generated on the control drive node in response to the drive current;
   detecting whether the control drive voltage has reached a first control drive threshold;
   providing a second charge current to the high side control node in response to detecting the voltage on the control drive node has reached the first control drive threshold;
   limiting the control drive voltage to a first clamped threshold; and
   limiting the control drive voltage to a second clamped threshold that is greater than the first clamped threshold.

17. The method of claim 16, where providing the second charge current comprises providing the second charge current that is less than the first charge current.

18. The method of claim 17, wherein providing the second charge current comprises providing the second charge current for a delay time after detecting the control drive voltage has reached the first control drive threshold.

19. The method of claim 18, wherein limiting the control drive voltage to the first clamped threshold comprises limiting the control drive voltage to a first clamped threshold during the delay time while providing the second charge current to the high side control node.

20. The method of claim 16, wherein the second clamped threshold is greater than the first clamped threshold but less than the supply voltage, and wherein the second charge current is provided for a delay time after detecting the control drive voltage has reached the first control drive threshold, and wherein limiting the control drive voltage to the second clamped threshold comprises limiting the control drive voltage after expiration of the delay time while providing the second charge current to the high side control node.

\* \* \* \* \*